United States Patent
Ritter et al.

(10) Patent No.: US 7,609,072 B2
(45) Date of Patent: Oct. 27, 2009

(54) PROCESSING TANTALUM CAPACITORS ON ASSEMBLED PWAS TO YIELD LOW FAILURE RATE

(75) Inventors: Allen Michael Ritter, Roanoke, VA (US); Todd David Greenleaf, Salem, VA (US)

(73) Assignee: General Electric Company, Schenectady, NY (US)

( * ) Notice: Subject to any disclaimer, the term of this patent is extended or adjusted under 35 U.S.C. 154(b) by 231 days.

(21) Appl. No.: 11/730,995

(22) Filed: Apr. 5, 2007

(65) Prior Publication Data

US 2008/0246492 A1 Oct. 9, 2008

(51) Int. Cl.
*G01R 27/26* (2006.01)
*G01R 31/12* (2006.01)

(52) U.S. Cl. .................... 324/676; 324/548
(58) Field of Classification Search ............. 324/548, 324/555, 658, 676
See application file for complete search history.

(56) References Cited

U.S. PATENT DOCUMENTS

| | | | |
|---|---|---|---|
| 3,268,809 A | 8/1966 | Meyer | |
| 3,850,764 A | 11/1974 | Herczog et al. | |
| 3,930,993 A | 1/1976 | Best et al. | |
| 3,943,439 A | 3/1976 | Raymond | |
| 4,067,786 A | 1/1978 | Hilbert et al. | |
| 4,160,284 A | 7/1979 | Deffeyes et al. | |
| 4,164,455 A | 8/1979 | Aronson et al. | |
| 4,184,112 A | 1/1980 | Cox | |
| 4,280,270 A | 7/1981 | Escher et al. | |
| 4,330,777 A | 5/1982 | McDuff | |
| 4,450,049 A | 5/1984 | Nakata et al. | |
| 4,706,375 A | 11/1987 | Bernard et al. | |
| 4,781,802 A | 11/1988 | Fresia | |
| 5,882,719 A | 3/1999 | Creasi, Jr. | |
| 6,054,864 A | 4/2000 | Butts | |
| 6,127,828 A | 10/2000 | Kamitani | |
| 6,687,173 B2 * | 2/2004 | Kang et al. ............. | 365/201 |
| 6,706,059 B2 | 3/2004 | Harguth et al. | |
| 6,761,728 B2 | 7/2004 | Harguth et al. | |
| 2001/0047190 A1 | 11/2001 | Harguth et al. | |

(Continued)

FOREIGN PATENT DOCUMENTS

GB   1 129 003   10/1968

(Continued)

OTHER PUBLICATIONS

European Search Report in corresponding Application No. 08154016.3-2216, dated Jul. 30, 2008.

*Primary Examiner*—Vincent Q Nguyen
(74) *Attorney, Agent, or Firm*—Nixon & Vanderhye P.C.

(57) ABSTRACT

A method of conditioning tantalum capacitors on printed wire assemblies is disclosed. According to the method, each of the capacitors on an assembly is subjected to the same conditioning level during testing. To condition the tantalum capacitors, surge currents are induced in the capacitors in a controlled manner as a way of aging the capacitors so that they can be used without de-rating rating with low failure rates. The level of voltage, timing and current levels are set by circuitry used to perform the testing. The same circuits that are used with the capacitors in a system application are also used for the tantalum capacitor test circuit during the conditioning process.

20 Claims, 3 Drawing Sheets

U.S. PATENT DOCUMENTS

| | | |
|---|---|---|
| 2002/0095186 A1 | 7/2002 | Harguth et al. |
| 2003/0020486 A1* | 1/2003 | Tsuchiya .................... 324/548 |
| 2004/0098058 A1 | 5/2004 | Harguth et al. |
| 2004/0186520 A1 | 9/2004 | Harguth et al. |
| 2004/0225327 A1 | 11/2004 | Norton et al. |

FOREIGN PATENT DOCUMENTS

| | | |
|---|---|---|
| JP | 58 102173 | 6/1983 |
| WO | WO 02/25294 A1 | 3/2002 |

* cited by examiner

PROCESSING TANTALUM CAPACITORS ON ASSEMBLED PWAS TO YIELD LOW FAILURE RATE

The present invention relates to reducing electronic component failures, and more particularly, to a method of conditioning tantalum capacitors to yield low failure rates, while avoiding severe failures for such components when used at full ratings.

BACKGROUND OF THE INVENTION

Experience gained in the production of power supplies shows that tantalum capacitors exhibit a high failure rate, where the tantalum capacitors were used as an energy reservoir to supply controlled pulses of current to a load. Production failures can occur at system level testing, where a failure can prove to be quite costly, with a loss of production, and significant man-hours lost to repair and replace costly system parts.

Failure modes of interest for tantalum capacitors are low impedance paths, or even short circuits, between the capacitor's anode and cathode. The root-cause of the tantalum capacitor failures was found to be the initial application of voltage and/or pulsed current supplied to and from the capacitors.

Although tantalum capacitor failure modes and the root cause of such failures are well known, the high failure rates associated with these components appear to be accepted in OEM industry. The trend in manufacturing has been the use of finer powders to make tantalum capacitors, driven by a demand for smaller components. industry's response has been to de-rate capacitors. Thus, for example, early Mil Spec standards de-rated capacitor voltages by 70%; more recently, however, the de-rating level has been more typically at 50%. See MIL-HDBK-217F Notice 2, which can be found at wwww-.weibull.com/knowledge/milhdbk.htm.

Prior to the testing and conditioning work described herein, there appeared to be no method for testing and conditioning tantalum capacitors to achieve a more robust device, beyond than that acknowledged by capacitor manufacturers. Present design practice in using tantalum capacitors in circuit designs calls for high de-rating factors, minimum circuit impedance (limit peak currents), and accepted failure rates that are too high for critical system design rates.

BRIEF DESCRIPTION OF THE INVENTION

The present invention is a method of reducing the failure rate of tantalum capacitors, and, in particular, when used in circuit assemblies, such as power supply printed wiring assemblies, by detecting failures of the tantalum capacitors before the circuit assembly is placed in a system to avoid detection of the failure at system level.

In accordance with the method, each of the capacitors in a circuit assembly is subjected to the same conditioning level during testing by conducting the testing with the capacitors mounted in the circuit assembly. To condition the tantalum capacitors, surge currents are induced in the capacitors in a controlled manner as a means of "aging" the components to thereby produce tantalum capacitors that can be used without de-rating at low failure rates. The level of voltage, timing and current levels are set by the circuitry of the test. Preferably, the same circuit assemblies that are used in a system application are also used for the tantalum capacitor test circuit during the conditioning process.

DETAILED DESCRIPTION OF THE INVENTION

The present invention is a method of reducing the failure rate of tantalum capacitors used in circuit assemblies by conditioning the capacitors in a "burn-in" tester for the purpose of screening the capacitors by detecting failures of the capacitors before the circuit assembly is placed in a system to thereby avoid failures at system level. The method of the present invention will be explained in terms of the tantalum capacitors used in a power supply module used as a sub-system in a system where high reliability is required. It should be understood, however, that the method is not limited to conditioning and screening tantalum capacitors used in a power supply assembly.

There can be multiple tantalum capacitors on a power supply assembly circuit card. Each of these capacitors is subjected to the same conditioning level during testing. Conditioning and testing of the tantalum capacitors is performed with the capacitors mounted on an assembled printed wire assembly.

Figure 2:
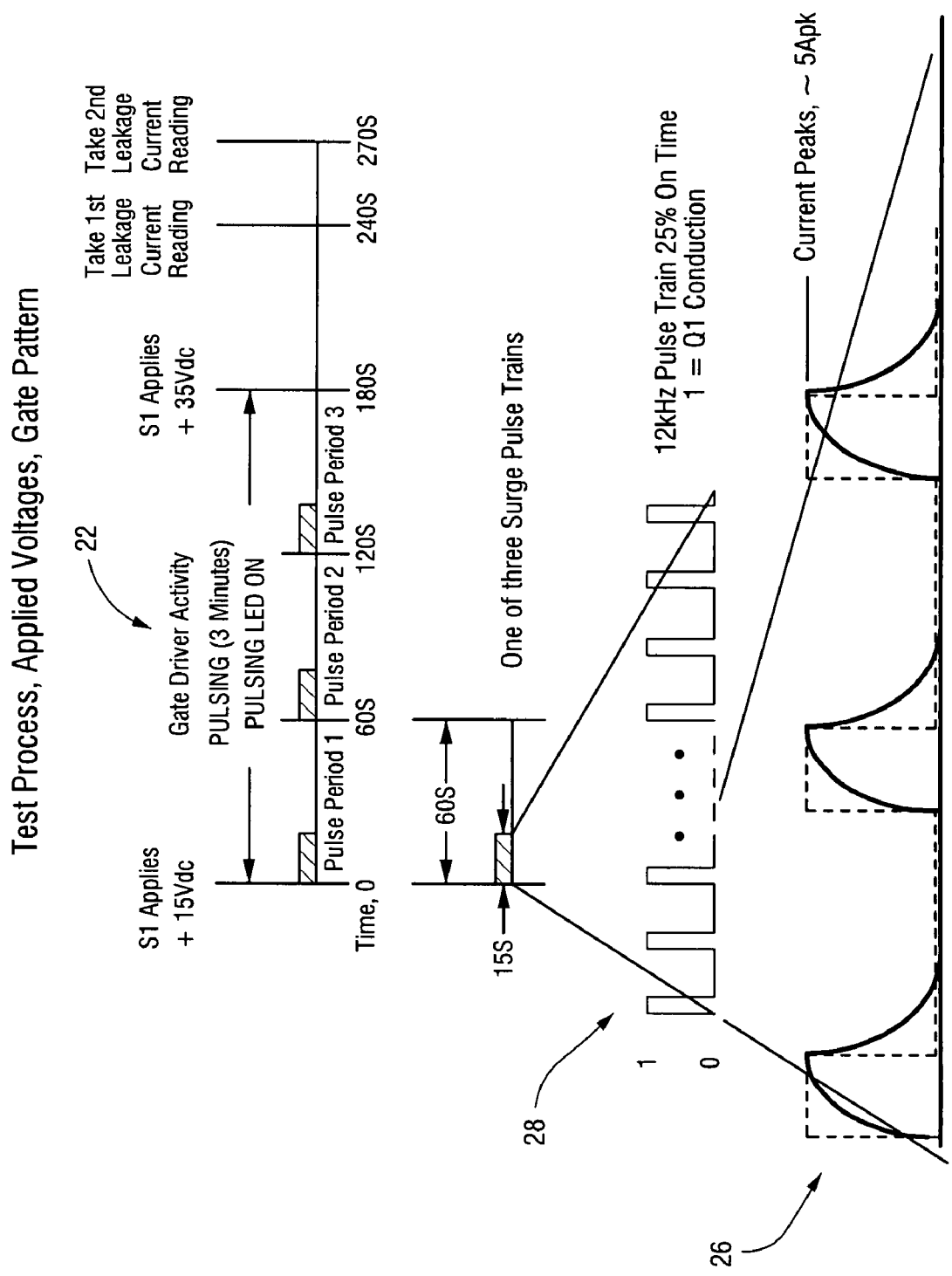
FIG. 2 shows several waveform sketches for the timing and levels of voltage pulses used to induce surge currents in tantalum capacitors being conditioned and screened.

To condition the tantalum capacitors, surge currents are induced in the capacitors in a controlled manner as a means of "aging" the components to thereby produce tantalum capacitors that can be used at without de-rating at low failure rates. The level of voltage, timing and current levels are set by the circuitry of the test and conditioning. FIG. 2 describes the timing and levels of the voltage pulses and resulting current surges used in this process.

Figure 1:
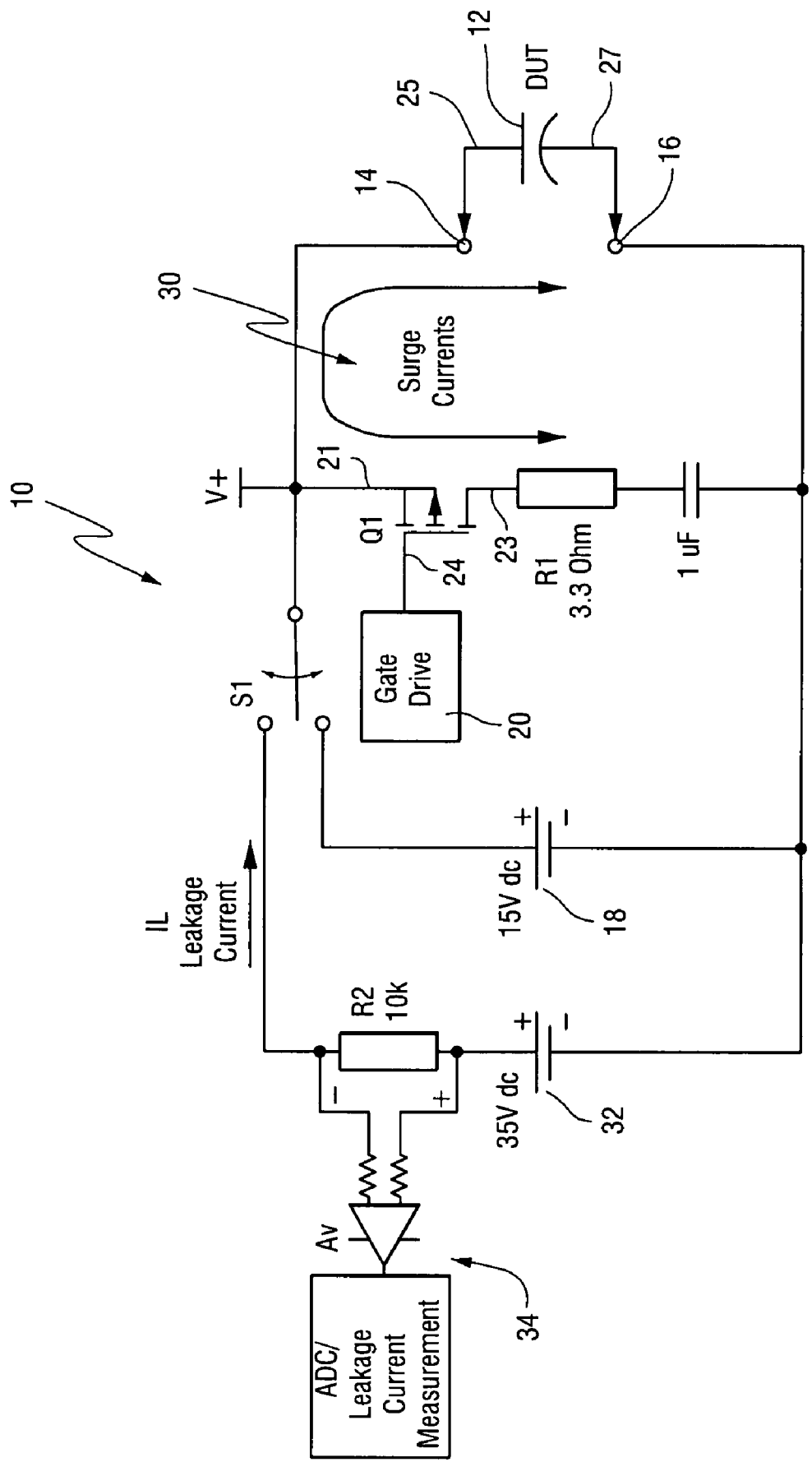
FIG. 1 is an example of a "burn-in" tester for performing tantalum capacitor conditioning and screening.

One approach that can be used to test and condition tantalum capacitors according to the present invention is to use the sub-system power supply circuit in which the capacitors are used as a burn-in test circuit for the capacitors. FIG. 1 shows a burn-in test circuit 10, that is based on power supply circuitry, and that is used to perform tantalum capacitor test and conditioning. It should be noted, however, that although the present invention is described in connection with power supply circuitry used for conditioning tantalum capacitors, the method of the present invention could practiced with other types of printed wire assemblies by directly probing the capacitors in such other assemblies and using, for example, the circuitry shown in FIG. 1 to test the capacitors. In that instance, the circuitry shown for example in FIG. 1 would be external to the printed wire assembly including the capacitors under test.

Referring to the test circuit 10 shown in FIG. 1, the first part of the tantalum capacitor screening involves subjecting a tantalum capacitor 12 to be tested to pulsed surge current conditioning. For this purpose, the tantalum capacitor 12 to be tested, which is typically referred to as the device under test ("DUT"), is inserted into test circuit 10 by connecting it's anode 25 and cathode 27 to terminals 14 and 16, respectively, of circuit 10. In the pulsed surge current conditioning, a voltage of +15VDC from a DC voltage supply 18, is first applied to DUT 12 through a switch S1. During this conditioning step, a power pulsing circuit 20 applies several series of voltages pulses 22 to the gate 24 of a Field Effect Transistor (FET) Q1 to produce the DUT surge currents 26 shown in FIG. 2. In one embodiment of the testing and conditioning method depicted in FIG. 2, there are three pulse periods in which a train of voltage pulses is applied to gate 24 of FET Q1. The number of pulse periods, or their duration in time, or the frequency or duty cycle of the pulses may be changed according to the size or voltage rating of the capacitor under test or to obtain leakage criteria, or yield, or a particular test time.

Referring now to FIG. 2, the time for Pulse Period 1 extends from the start of the test, i.e., from 0 seconds to 60 seconds after the start of the test. In this first time period, a series of voltage pulses 28, occurring at a frequency of preferably 12 kHz and having an on time of preferably 25%, are applied to gate 24 of FET Q1. The resultant switching of FET Q1 produces a series of corresponding voltage pulses occurring at the source 21 of FET Q1 and at the anode 25 of tantalum capacitor DUT 12, resulting in the production of surge currents 30 through DUT 12 and FET Q1 at a corresponding rate of 12 kHz, with a 50% Duty Cycle for a period of 15 seconds over the 60 seconds constituting Pulse Period 1. For the circuit and components shown in FIG. 1, the peak surge current level through DUT 12 is approximately 5 Amps. To protect FET Q1 from failing due to an unlimited amount of current flowing through it during the surge current testing, a small resistor R1 is connected in series with the drain of FET Q1 to limit the amount of current flowing through it. Preferably, resistor R1 has a value of 3.3Ω. To provide thermal relief to circuit 10, a waiting period of 45 seconds is allowed to lapse before the initiation of Pulse Period 2, also shown in FIG. 2.

The time for Pulse Period 2 extends from 60 seconds after the start of the test to 120 seconds after the start of the test. In this second time period, a second series of voltage pulses 28, occurring again at a frequency of preferably 12 kHz and having an on time of preferably 25%, are applied to gate 24 of FET Q1. The resultant switching of FET Q1 again produces a series of corresponding voltage pulses occurring at the source 21 of FET Q1 and at the anode 25 of tantalum capacitor DUT 12, resulting in the production of surge currents 30 through DUT 12 and FET Q1, again at a corresponding rate of 12 kHz, with a 50% Duty Cycle for a period of 15 seconds over the 60 seconds constituting Pulse Period 2. Here again, the peak surge current level through DUT 12 is again approximately 5 Amps. And, again, to provide thermal relief to circuit 10, a waiting period of 45 seconds is allowed to lapse before the initiation of Pulse Period 3 shown in FIG. 2.

The time for Pulse Period 3 extends from 120 seconds after the start of the test to 180 seconds after the start of the test. In this third time period, a third series of voltage pulses 28, occurring once more at a frequency of preferably 12 kHz and having an on time of preferably 25%, are applied to gate 24 of FET Q1. The resultant switching of FET Q1 once more produces a series of corresponding voltage pulses occurring at the source 21 of FET Q1 and at the anode 25 of tantalum capacitor DUT 12, resulting again in the production of surge currents 30 through DUT 12 and FET Q1, again at a corresponding rate of 12 kHz, with a 50% Duty Cycle for a period of 15 seconds over the 60 seconds constituting Pulse Period 3. Once more, the peak surge current level through DUT 12 is approximately 5 Amps, and again, to provide thermal relief to circuit 10, a waiting period of 45 seconds is allowed to lapse before the initiation of next part of the capacitor testing shown in FIG. 2.

The next part of the capacitor screening test process involves subjecting DUT 12 to leakage current measurements for purposes of grading DUT 12. The leakage current test is initiated at the end of Pulse Period 3, i.e., at 180 seconds, at which point, a DC voltage of 35VDC is applied to DUT 12 through switch S1 from a second DC voltage supply 32. During the leakage current test, Gate Drive circuit 20 does not apply voltages pulses 22 to the gate 24 of a FET Q1, such that FET Q1 is not conducting.

The DC voltage of 35VDC is applied to DUT 12 for a period of preferably 60 seconds. Thus, a time equal to 240 seconds leakage current measurements for DUT 12 are begun. The leakage current measurements are done preferably twice over the entire interval of 80 seconds beginning at a time of 180 seconds and ending at a time of 270 seconds. The leakage current level through DUT 12 is measured at least two times (minimum) over this entire interval, with measurements being recorded preferably first at 240 seconds and then again at 270 seconds. The leakage current test measurements are taken by measuring the voltage across a known value resistor R2 that is connected in series with DUT 12. Preferably, resistor R2 has a value of 10 k Ω. The voltage measurement is taken using a meter 34 shown in FIG. 1.

Figure 3:
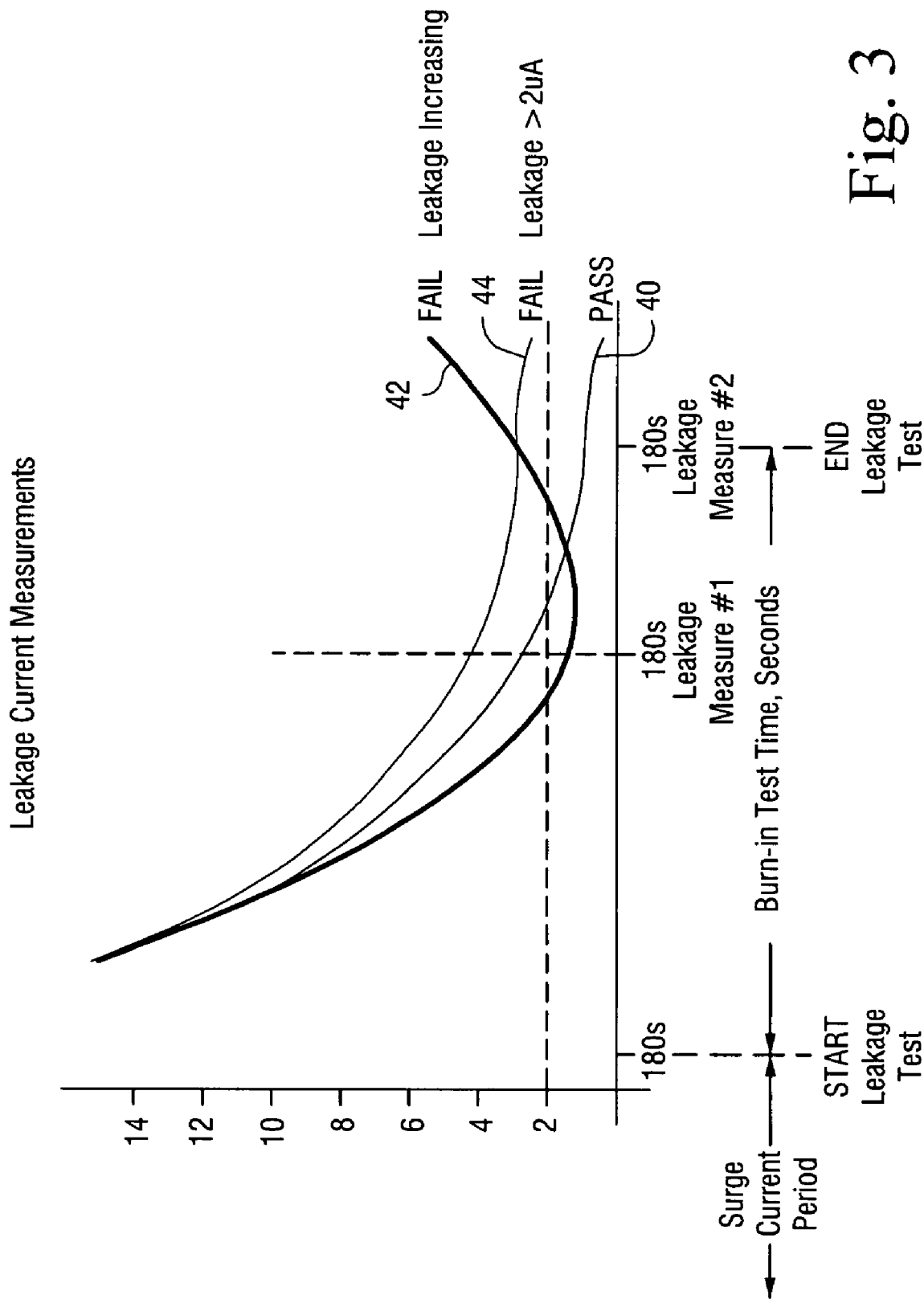
FIG. 3 is a drawing showing leakage current measurements by tantalum capacitors conditioned and screened using the "burn-in" tester shown in FIG. 1.

Referring now to FIG. 3, DUT 12 is then graded on the basis of the results of the leakage current measurements taken for DUT 12.

Tantalum capacitor DUT 12 is considered to have a passing grade where (1) DUT 12 has a level of leakage current that is decreasing over time, based on the measurements taken at 240 seconds and 270 seconds; or (2) DUT 12 has a level of leakage current that is less than 2 uA at 270 seconds.

Passing grade results are reflected in curve 40 shown in FIG. 3. Tantalum Capacitor DUT 12 is considered to have a failing grade where (1) DUT 12 has a level of leakage current that is increasing over time, based on the measurements taken at 240 seconds and 270 seconds; or (2) DUT 12 has a level of leakage current that is greater than 2 uA at 270 seconds.

A failing grade result where DUT 12 has a level of leakage current that is increasing over time is reflected in curve 42 shown in FIG. 3. A failing grade result where DUT 12 has a level of leakage current that is greater than 2 uA at 270 seconds is reflected in curve 44 shown in FIG. 3. A failed DUT can be retested (i.e., subjected to a second conditioning) or discarded. Previous data indicates that (1) most capacitors will pass the conditioning test after a second test is performed; and (2) capacitors that fail a second test will never pass with a level of leakage current that is less than 2 uA.

Early production data indicated that the failure rate of the power supply tantalum capacitors was 2%, as found during system level burn-in tests. Due to the large number of these capacitors used in a single system, the 2% capacitor failure rate translated to 20-50% of the system failures, with the result being costly damages to the system.

When performing the power supply tantalum capacitor conditioning test described above, the failure rate for the tantalum capacitors was found to be 2-5%. Thus, the failure rate of the capacitors was found to be higher at the printed wire assembly burn-in level, compared to that previously found at the system burn-in level. This suggests that the power supply tantalum capacitor conditioning process is more stressful than the actual application in which the tantalum capacitors are used, which offers a margin during the screen process.

Tracking of power supply tantalum capacitors that were processed through the power supply tantalum capacitor conditioning test described above indicated that the capacitors passed the infant mortality region, with a result of near zero system failures.

The conditioning process for tantalum capacitors can be used with any printed wire assemblies using tantalum capacitors. The process can be extended to the discrete component level to produce high reliability tantalum capacitors for printed wire assembly applications. The process can be used on both leaded and SMT components.

The process of the present invention, when used at the discrete component level, can produce a high quality, high capacitance device that can be used in applications that typically call for high capacitance ceramic capacitors, which typically cost 10-30 times the cost of tantalum capacitors, based on a per micro-farad basis. One possible conditioner and tester application includes Switched Mode Power Supplies.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of conditioning and screening tantalum capacitors, the method comprising:
   for each tantalum capacitor to be tested, aging the capacitor by applying a plurality of series of voltage pulses across the capacitor to induce a plurality of series of surge currents through the capacitor,
   subsequent to aging the capacitor, applying a predetermined voltage across the capacitor and measuring leakage current flowing through the capacitor at predetermined intervals of time after the predetermined voltage has been applied across the capacitor,
   determining whether the capacitor is acceptable on the basis of the leakage current measurements taken for the capacitor,
   the capacitor being determined to be acceptable where the capacitor has a level of leakage current that is decreasing over time, or that is less than a predetermined current level at a selected one of the predetermined intervals of time,
   the capacitor being determined to not be acceptable where the capacitor has a level of leakage current that is increasing over time, or that is equal to or greater than the predetermined current level at the selected one of the predetermined intervals of time.

2. The method of claim 1 wherein a plurality of series of voltage pulses are applied across the capacitor to induce a plurality of series of surge currents through the capacitor.

3. The method of claim 2 wherein three series of voltage pulses are applied across the capacitor.

4. The method of claim 3 wherein each of the series of voltage pulses is part of a pulse period of a predetermined duration.

5. The method of claim 4 wherein each of the pulse periods includes one of the series of voltage pulses followed by an interval of time in which no voltage pulses are applied to the capacitor.

6. The method of claim 4 wherein each pulse period has a duration of 60 seconds.

7. The method of claim 1 wherein the series of voltage pulses have a predetermined peak voltage value, a predetermined frequency and a predetermined on time.

8. The method of claim 7 wherein the series of voltage pulses have a peak voltage value of 15 volts, occurs at a frequency of 12 kHz and has an on time of 25%.

9. The method of claim 1 wherein the series of current pulses have a predetermined frequency and a predetermined on time and a predetermined duty cycle.

10. The method of claim 9 wherein the series of current pulses have a frequency of 12 kzHz, a 25% on time and a duty cycle of 50%.

11. The method of claim 1 wherein the voltage applied across the capacitor is applied for a predetermined period of time before the leakage current measurements are taken.

12. The method of claim 1 wherein the predetermined intervals of time at which leakage current through the capacitor is measured begin at a predetermined amount of time after the end of the third pulse period.

13. A method of conditioning and screening tantalum capacitors, the method comprising:
   for each tantalum capacitor to be tested, applying a series of voltage pulses across the capacitor to induce a series of surge currents through the capacitor,
   applying a predetermined voltage across the capacitor and measuring leakage current flowing through the capacitor at predetermined intervals of time after the predetermined voltage has been applied across the capacitor,
   determining whether the capacitor is acceptable on the basis of the leakage current measurements taken for the capacitor,
   the capacitor being determined to be acceptable where the capacitor has a level of leakage current that is decreasing over time, or that is less than a predetermined current level at a selected one of the predetermined intervals of time,
   the capacitor being determined to not be acceptable where the capacitor has a level of leakage current that is increasing over time, or that is equal to or greater than the predetermined current level at the selected one of the predetermined intervals of time;
   wherein the predetermined intervals of time at which leakage current through the capacitor is measured begin at a predetermined amount of time after the end of the third pulse period, and
   wherein the predetermined amount of time after the end of the third pulse period is equal to the duration of time for each pulse period.

14. The method of claim 13 wherein each of the pulse periods is 60 seconds in duration.

15. The method of claim 13 wherein a first current leakage measurement taken at a first predetermined period of time after the end of the third pulse period and a second current leakage measurement taken at a second predetermined period of time after the end of the third pulse period are compared to determine whether the leakage current flowing through the capacitor is increasing or decreasing over time.

16. The method of claim 13 wherein the first current leakage measurement is taken 60 seconds after the end of the third pulse period and the second current leakage measurement is taken 90 seconds after the end of the third pulse period.

17. The method of claim 15 wherein the second current leakage measurement taken after the end of the third pulse period is used to determine whether the leakage current through the capacitor is 2 µA.

18. The method of claim 15 wherein the predetermined voltage applied across the capacitor is a DC voltage applied for a predetermined period of time.

19. A method of aging tantalum capacitors to thereby condition the capacitors for screening to yield capacitors that are usable without de-rating at low failure rates, the method comprising:
   for each tantalum capacitor to be tested, aging the capacitor by applying over each of a plurality of pulse periods having a predetermined duration of time, a series of voltage pulses across the capacitor to induce a plurality of surge currents through the capacitor, subsequent to aging the capacitor, applying a predetermined DC voltage across the capacitor for a predetermined period of time and measuring leakage current a plurality of times at predetermined intervals of time after the predetermined DC voltage has been applied across the capacitor, grading the capacitor on the basis of the results of the leakage current measurements taken for the capacitor, the capacitor being determined to have a passing grade where the capacitor has a level of leakage current that is decreasing over time, or that is less than a predetermined current at a predetermined one of the predetermined intervals of time, the capacitor being determined to have a failing grade where the capacitor has a level of leakage current that is increasing over time, or that is greater than a predetermined current at a predetermined one of the predetermined intervals of time.

20. A circuit for aging tantalum capacitors to thereby condition the capacitors for screening to yield capacitors that are usable without de-rating at low failure rates, the circuit comprising:

a first voltage supply that applies across a capacitor to be tested a first DC voltage, a circuit that switches the first DC voltage applied across the capacitor so as to age the capacitor by applying several series of voltage pulses across the capacitor over a plurality of pulse periods of predetermined duration, a second voltage supply that applies across the capacitor, subsequent to aging the capacitor, a second DC voltage different from the first DC voltage, a circuit that measures leakage current a plurality of times over predetermined intervals of time after the second DC voltage has been applied across the capacitor, wherein the capacitor is determined to be acceptable or not on the basis of the results of the leakage current measurements taken for the capacitor, the capacitor being determined to be acceptable where the capacitor has a level of leakage current that is decreasing over time, or that is less than a predetermined current at a predetermined one of the predetermined intervals of time, the capacitor being determined to not be acceptable where the capacitor has a level of leakage current that is increasing over time, or that is greater than a predetermined current at a predetermined one of the predetermined intervals of time.

\* \* \* \* \*